United States Patent [19]

Abend et al.

[11] Patent Number: 4,549,338
[45] Date of Patent: Oct. 29, 1985

[54] METHOD OF FABRICATING AN IC INCLUDING ELECTRO-OPTICAL TRANSMITTERS AND RECEIVERS

[75] Inventors: Robert J. Abend, Palm Bay; C. Byron Shelton, Jr., Sattelite Beach, both of Fla.

[73] Assignee: Harris Corporation, Melbourne, Fla.

[21] Appl. No.: 553,114

[22] Filed: Nov. 18, 1983

[51] Int. Cl.[4] .................. H01L 21/20; H01L 21/302; H01L 21/76; H01L 31/12
[52] U.S. Cl. .................... 29/569 L; 29/572; 29/576 W; 29/580; 148/1.5; 148/DIG. 50; 357/49
[58] Field of Search ............... 29/569 L, 572, 576 W, 29/580, 581, 582, 583; 148/1.5, 171, 174, 175, 176, DIG. 26, DIG. 50, DIG. 93, DIG. 135; 357/49

[56] References Cited

U.S. PATENT DOCUMENTS

| | | | |
|---|---|---|---|
| 3,486,029 | 12/1969 | Barrett et al. | 250/217 |
| 3,914,137 | 10/1975 | Huffman et al. | 148/175 |
| 3,985,590 | 10/1976 | Mason | 148/175 |
| 4,041,475 | 8/1977 | Javan | 340/173 LS |
| 4,274,104 | 6/1981 | Fang et al. | 357/19 |
| 4,408,386 | 10/1983 | Takayashiki et al. | 29/576 W X |

OTHER PUBLICATIONS

Fastow, R. M. et al., "Laser Growth of Thin Silicon Crystals in Patterned Structures" in *Laser and Electron-Beam Solid Interactions and Materials Processing*, Gibbons, Hess and Sigmon, Eds., El Sevier North Holland, Inc., 1981.

*Primary Examiner*—Brian E. Hearn
*Assistant Examiner*—Alan E. Schiavelli
*Attorney, Agent, or Firm*—Barnes & Thornburg

[57] ABSTRACT

An integrated circuit having active devices in electro-optical conversion material regions and single crystal silicon regions which are in a polycrystalline silicon support. The electro-optical conversion material regions are separated from the polycrystalline silicon by a containment layer. The method includes forming trenches in a wafer of electro-optical conversion material, covering the trenches with a containment layer and overfilling with polycrystalline silicon, removing material to expose polycrystalline silicon in the trenches and converting exposed portions of the polycrystalline silicon to single crystal silicon.

7 Claims, 5 Drawing Figures

METHOD OF FABRICATING AN IC INCLUDING ELECTRO-OPTICAL TRANSMITTERS AND RECEIVERS

BACKGROUND AND SUMMARY OF THE INVENTION

The present invention relates generally to packaged integrated circuits, and more specifically to a scheme for substantially increasing the number of input and output ports for a packaged integrated circuit.

With the ability to form denser circuits on, for example, LSI and VLSI, the number of input and output ports which must be provided exceeds the present integrated circuit assembly technology. The die or wafer in which the circuits are built, presently are connected on the chip by interconnects to bond pads available on the periphery of the chip. Thus, the number of bond pads are limited by the peripheral dimension of the chip taking into consideration required minimum spacing between bond pads and minimum bond pad area. Also, the requirement to run interconnects from the circuits displaced from the periphery of the die to the bond pads place design restraints on the integrated circuit layout as well as producing undesirable capacitance and increased resistance. Similarly, with the present technology, the method of connecting the bond pads to the external pins via bonded wires limit the pin count as well as pin reliability. As the pin count moves upward of 100 pins, a very small error rate in the bond wires at increased pin counts will become undesirable and approach asymtotically zero.

To overcome the problems of the prior art and provide a substantially unlimited number of input-output ports for a packaged integrated circuit, it is proposed that optical input and output ports be provided throughout the integrated circuit. This does not limit the input output ports of the periphery of the integrated circuit and also substantially reduces the interconnects running across the circuit. Similarly, reliability or yield of the packaged integrated circuits is increased. The integrated circuit includes a polycrystalline support material having single crystalline silicon regions in the surface and electro-optical conversion material regions also in the surface. The circuits of the integrated circuit are formed in the silicon regions and the transmitting and receiving means are built in the electro-optical conversion material regions. Alternatively, the receiving means may be formed in single crystal silicon regions. The integrated circuit die is mounted into the base of a housing and the lid of the housing, which includes apertures and optical conduits, is aligned to the transmitting and receiving means on the die before the lid is secured to the body of the housing. Electrical conductors may be provided exterior to the housing for power inputs.

A method of assembly includes providing a plurality of alignment optical signal emitting devices on the die or wafer, mounting the wafer in the base of the housing, providing a corresponding plurality of alignment optical signal conduits in the lid, activating the plurality of alignment optical signal emitting devices and aligning the corresponding optical signal conduits with respective alignment optical signal emitting devices before securing the lid to the base.

The method of fabricating the monolithic integrated circuit having the electro-optical material and single crystalline silicon in the surface of a polycrystalline support includes forming trenches in the first surface of a wafer of electro-optical conversion material and covering the first surface and trench with a containment layer. The trenches are then overfilled with polycrystalline silicon material and electro-optical conversion material is removed from a second side of the wafer opposite the first surface to a level exposing the polycrystalline silicon in the trenches. Selective portions of the polycrystalline silicon is converted to single crystalline silicon. Active devices are formed in the electro-optical conversion material and the single crystalline silicon. The polycrystalline silicon is converted to single crystal silicon by the use of a laser. The top surface of the electro-optical material being a compound of gallium is covered by a containment layer during the device formations in the single crystal silicon.

The use of optical transmission reception between integrated circuits is known as shown by Barrett et al. in U.S. Pat. No. 3,486,029. The two discreet interconnected circuits are mounted on adjacent printed circuit boards, namely—discreet unpackaged device. Other forms of photo-optical interconnection is described by Javan in U.S. Pat. No. 4,041,475. This shows a memory system having optical transmitters and receivers in each cell location using a laser to selectively scan the surface to the appropriate location. Thus, Javan uses optical communications in lieu of addressing to read and write in discreet locations of an exposed or non-housed integrated circuit. Optical communication between regions on a gallium arsenide chip and to regions off the chip is illustrated by Fang et al. in U.S. Pat. No. 4,274,104.

Although the patents of the prior art shows optical communication on and to and from an integrated circuit, it fails to recognize the ability to use optical connectors to substantially increase the input-output ports on a packaged integrated circuit as well as providing the structure and method of fabricating the unique integrated circuit.

Other objects, advantages and novel features of the present invention will become apparent from the following detailed description of the invention when considered in conjunction with the accompanying drawings.

DETAILED DESCRIPTION OF THE DRAWINGS

Figure 1:
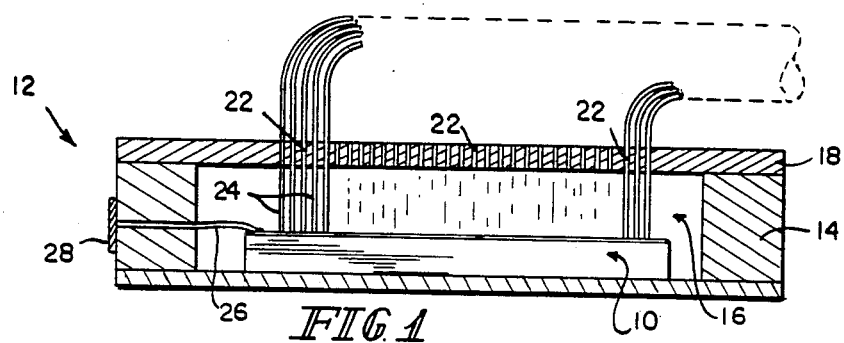
FIG. 1 is a cross-section of an integrated circuit in a housing according to the principles of the present invention.
Figure 2:
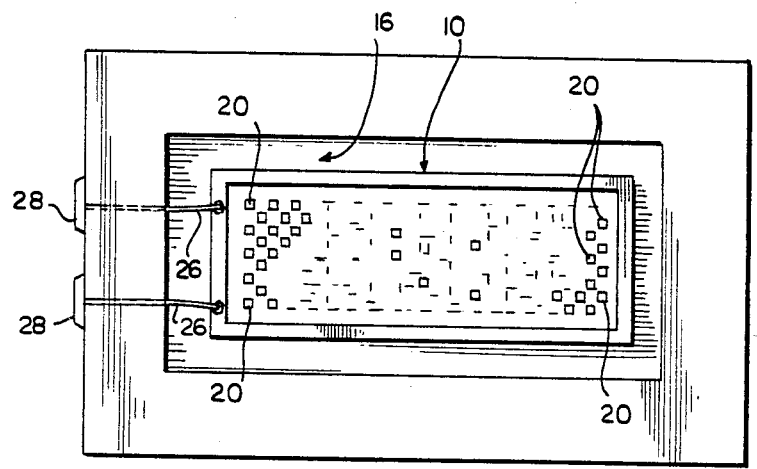
FIG. 2 is a top view of the integrated circuit and housing of FIG. 1 with the lid removed.

As illustrated in FIG. 1, a wafer die 10 is received in a housing 12 which includes a body portion 14 having a cavity 16 therein and a lid 18. The die 10 has a plurality of light receiving and light transmitting areas 20 distributed throughout the surface of the die 10. The lid 18 includes a plurality of apertures 22 having a corresponding plurality of optical conduits 24 therein extending down towards the surface of the die 10. The optical conduits 24 correspond to and align with the optical transmitting and receiving areas 20 on the die. In the embodiment illustrated in FIGS. 1 and 2, power leads 26 are connected to the die 10 and to external electrical contacts 28 on the exterior of the housing 12. Although this is shown as edge contact, the external contacts 28 may also be pins or other types of connectors depending upon the hardware with which it is to be used. Also, it should be noted that the power and ground may be provided to the die 10 by optical means in low power circuits. In addition to the optical receiving and transmitting areas 20, the die 10 includes a plurality of active circuit devices (not shown). As is evident from FIG. 2, the number of input and output ports art not limited by the periphery of the chip and since the input and output ports 20 are located throughout the chip, the length and number of interconnects are reduced which reduces resistance and capacitance as well as design restraints.

The method of assembly includes mounting the die 10 within the cavity 16 of the body portion 14 of the housing 12. Power is applied to external contacts 28 which will activate a plurality, preferably four light transmitting areas 20 on the surface of the die 10. The lid 18 having light conduits 24 mounted therein is then positioned over the wafer 10 until a corresponding plurality of light conduits 24, preferably four, are aligned with the four light emitting regions 20 on the die. Once this alignment is achieved, the lid 18 is secured to the body 14 of the housing. By aligning the light conduits 24 to the light emitting or transmitting areas 20 on the die, the positioning of the die 10 within the cavity 16 of the body 14 is not critical. Also, this will allow for tolerance in the manufacture of the lid 18 relative to the body 14.

For a typical example, the light emitting and transmitting areas 20 will have a cross-sectional area of 1 to 4 mils and the optical conduits 24 can be fiber optics having a diameter of 4.5 mils. Light conduits 24 may either be inserted through apertures 22 in lid 18 or the lid 18 may be formed about the light conduits 24. It should be noted that there is no necessity for the light conduits 24 to be secured or joined to the surface of the wafer 10.

Figure 3:
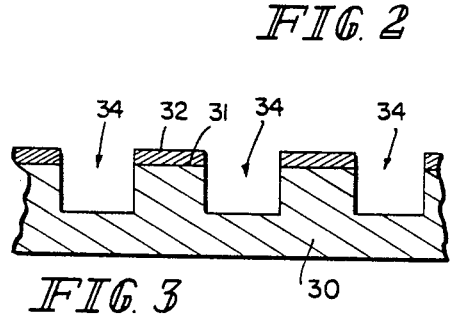
FIGS. 3 through 5 are cross-sections of a wafer illustrating a method of fabrication according to the principles of the present invention.
Figure 4:
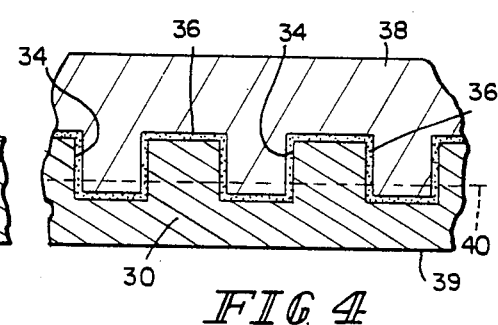
Figure 5:
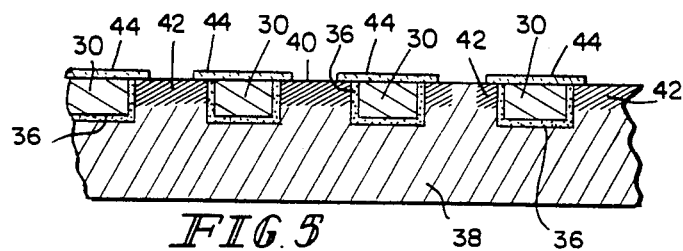

The method of fabricating the integrated circuit having active circuit devices formed in single crystalline silicon and light transmitting devices in a compound of gallium provided in a polycrystalline support is illustrated in FIGS. 3 through 5. The process of fabrication begins with the formation of trenches 34 in surface 31 of a gallium substrate 30 which has a mask layer 32 thereon. The trenches 34 may be formed by etching which includes reactive ion etching, as well as wet chemical etching. The gallium substrate 30 may preferably be a gallium arsenide or a gallium phosphide substrate. Although the trenches 34 illustrated are substantially rectangular, they may be V-shaped, depending upon the crystalline orientation of the surface 31. The resulting structure is illustrated in FIG. 3.

The mask layer 32 is removed and the surface 31 as well as the surface of the trenches 34 are coated with a containment layer 36. The containment layer is used to prevent out diffusion of the impurities from the gallium compound 30 during the high temperature manufacturing steps. Such an out diffusion seriously effects the electro-optical characteristics of the gallium compound 30. Containment layer 36 is preferably silicon nitride, although silicon dioxide may be used. As an example, the containment layer 36 or silicon nitride may have a thickness in the range of 5,000 Angstroms to 10,000 Angstroms.

Following the application of the silicon nitride layer 36, the trenches are overfilled with polycrystalline silicon to form the support layer 38 as illustrated in FIG. 4. The gallium substrate 30 is removed from its surface 39 down to a line 40 which will expose the polycrystalline silicon material 38 in the trenches 34. This removal may be by grinding wet etch, dry etch or electro-chemical etching or any combination thereof.

Portion of the polycrystalline silicon 38 at surface 40 are converted to single crystalline silicon using, for example, laser refinement. The laser is scanned to the appropriate areas to refine the polycrystalline silicon to single crystal large grain structures. A Q switched YAG laser with a wave length of 1.064 micrometers having an energy level of 100 milliwatts/square centimeter applied as a 150 nano second pulse, stepped at a distance of 20 micrometers and a repetition rate of 4 kilohertz will produce the required refinement. The resulting single crystal silicon regions 42 are illustrated in FIG. 5.

The gallium compound regions 30, in the polycrystalline support 38, are next covered with a containment layer 44, preferably silicon nitride. This layer is then patterned to expose the single crystal layers 42. The appropriate devices are formed in the single crystal silicon layer 40 using well known methods. Subsequent to the device formations in the single crystal layer 42, the top containment layer 44 is patterned to allow the formation of electro-optical transmitting devices in the gallium compound regions 30. It should be noted that electro-optical receiving devices may be formed either in the single crystalline regions 42 or in the gallium compound regions 30.

The appropriate layers of insulation are provided and surface interconnects are provided between the appropriate circuits in the single crystal silicon regions 42 and the electro-optical transmitting devices in the gallium layer 30.

It should be noted that the use of silicon nitride as a containment layer 36 and especially as the surface containment layer 44 is preferred since oxide is used as an insulative as well as a masking layer for the single crystal silicon regions 42. Thus, the etchants used in forming masks as well as vias to the single crystal silicon regions 42 will not effect the silicon nitride layers 36 and 44 and thus their integrity as a containment layer is not jeopardized during the high temperature processing.

Other methods may be used to form an integrated circuit or wafer having a polysilicon support structure with single crystalline and gallium compound regions formed therein. Although such other methods may be used, the aforementioned method is preferred since it includes the fewest number of steps. The devices formed in the single crystal silicon region 42 are isolated from each other by junction isolation. Alternatively, used another method, dielectric isolation may be provided between the polysilicon support 38 and the single crystal silicon regions 42.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of this invention are to be limited only by the terms of the appended claims.

What is claimed is:

1. A method of fabricating an integrated circuit comprising:

forming trenches in a first surface of a wafer of electro-optical transmitting material;

covering said first surface and trenches with a containment layer to prevent diffusion of impurities from said electro-optical transmitting material during subsequent steps;

overfilling said trenches with polycrystalline silicon material;

removing material from a second surface of said wafer opposite said first surface to a level exposing said polycrystalline silicon in said trenches;

converting exposed portions of said polycrystalline silicon to single crystal silicon; and forming active devices in exposed portions of said electro-optical transmitting material and single crystal silicon.

2. A method according to claim 1 wherein said electro-optical material is a compound of gallium.

3. A method according to claim 1 including forming conductors between said active devices in said electro-optical transmitting material and devices in said single crystal silicon.

4. The method according to claim 1 including covering exposed surfaces of said electro-optical transmitting material with a top containment layer to prevent diffusion of impurities from said electro-optical transmitting material during device formation in said single crystal silicon steps.

5. The method according to claim 4 wherein said top containment layer is silicon nitride.

6. The method according to claim 1 wherein said converting step includes applying a laser to selected areas of said polycrystalline silicon to refine it to a single crystal structure.

7. The method according to claim 1 wherein said containment layer is a compound of silicon.

* * * * *